United States Patent
Take et al.

(10) Patent No.: US 10,727,146 B2
(45) Date of Patent: Jul. 28, 2020

(54) SEMICONDUCTOR DEVICE

(71) Applicant: TOYOTA JIDOSHA KABUSHIKI KAISHA, Toyota-shi, Aichi-ken (JP)

(72) Inventors: Naoya Take, Toyota (JP); Sachio Kodama, Toyota (JP); Masanori Ooshima, Kariya (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 16/173,598

(22) Filed: Oct. 29, 2018

(65) Prior Publication Data
US 2019/0131199 A1 May 2, 2019

(30) Foreign Application Priority Data
Oct. 31, 2017 (JP) .................. 2017-211336

(51) Int. Cl.
*H01L 23/31* (2006.01)
*H01L 23/00* (2006.01)
(Continued)

(52) U.S. Cl.
CPC ...... *H01L 23/3142* (2013.01); *H01L 21/4821* (2013.01); *H01L 23/051* (2013.01); *H01L 23/29* (2013.01); *H01L 23/3121* (2013.01); *H01L 23/367* (2013.01); *H01L 23/3736* (2013.01); *H01L 23/4334* (2013.01); *H01L 23/49* (2013.01); *H01L 23/4952* (2013.01); *H01L 23/49548* (2013.01); *H01L 23/49551* (2013.01); *H01L 23/49562* (2013.01); *H01L 23/49568* (2013.01); *H01L 24/85* (2013.01); *H01L 23/3107* (2013.01); *H01L 23/49575* (2013.01); *H01L 24/05* (2013.01); *H01L 24/06* (2013.01); *H01L 24/32* (2013.01); *H01L 24/33* (2013.01);
(Continued)

(58) Field of Classification Search
None
See application file for complete search history.

(56) References Cited

U.S. PATENT DOCUMENTS 6,831,372 B2 * 12/2004 Ruhland ............. H01L 23/3107
257/666
8,420,446 B2 * 4/2013 Yo ........................... C25D 5/12
257/E21.505
(Continued)

FOREIGN PATENT DOCUMENTS

JP 2017055044 A 3/2017

*Primary Examiner* — Zandra V Smith
*Assistant Examiner* — Lawrence C Tynes, Jr.
(74) *Attorney, Agent, or Firm* — Hunton Andrews Kurth LLP

(57) ABSTRACT

A semiconductor device may include a semiconductor element including a signal pad, an encapsulant encapsulating the semiconductor element and a lead including a first end located outside the encapsulant and a second end located within the encapsulant. The lead may be connected to the signal pad via a bonding wire within the encapsulant. The lead may include an upper surface extending from the first end to the second end. The upper surface may include a joined section where the bonding wire is joined and a rough section located within the encapsulant and having a higher surface roughness than the joined section. The rough section may be at least partly located lower than the joined section.

8 Claims, 4 Drawing Sheets

(51) Int. Cl.
*H01L 23/495* (2006.01)
*H01L 23/29* (2006.01)
*H01L 23/367* (2006.01)
*H01L 23/373* (2006.01)
*H01L 23/49* (2006.01)
*H01L 21/48* (2006.01)
*H01L 23/433* (2006.01)
*H01L 23/051* (2006.01)

(52) U.S. Cl.
CPC .............. *H01L 24/45* (2013.01); *H01L 24/48* (2013.01); *H01L 24/49* (2013.01); *H01L 24/73* (2013.01); *H01L 2224/04026* (2013.01); *H01L 2224/04042* (2013.01); *H01L 2224/05553* (2013.01); *H01L 2224/05554* (2013.01); *H01L 2224/05624* (2013.01); *H01L 2224/05644* (2013.01); *H01L 2224/05647* (2013.01); *H01L 2224/05655* (2013.01); *H01L 2224/0603* (2013.01); *H01L 2224/06051* (2013.01); *H01L 2224/06181* (2013.01); *H01L 2224/32245* (2013.01); *H01L 2224/33181* (2013.01); *H01L 2224/45124* (2013.01); *H01L 2224/45147* (2013.01); *H01L 2224/48091* (2013.01); *H01L 2224/48247* (2013.01); *H01L 2224/49171* (2013.01); *H01L 2224/49175* (2013.01); *H01L 2224/73215* (2013.01); *H01L 2224/73265* (2013.01); *H01L 2224/85016* (2013.01); *H01L 2224/85447* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01)

(56) References Cited

U.S. PATENT DOCUMENTS

| | | | |
|---|---|---|---|
| 8,742,554 B2* | 6/2014 | Shimazaki | H01L 21/561 257/666 |
| 9,679,832 B1* | 6/2017 | Heng | H01L 23/49513 |
| 9,793,194 B2* | 10/2017 | Hayashi | H01L 23/49506 |
| 9,831,158 B2* | 11/2017 | Hayashi | H01L 23/3114 |
| 2006/0097366 A1* | 5/2006 | Sirinorakul | H01L 23/495 257/666 |
| 2012/0205790 A1* | 8/2012 | Haga | H01L 21/4842 257/676 |
| 2018/0151479 A1* | 5/2018 | Nishikizawa | H01L 24/83 |

* cited by examiner

SEMICONDUCTOR DEVICE

CROSS-REFERENCE

This application claims priority to Japanese Patent Application No. 2017-211336, filed on Oct. 31, 2017, contents of which are incorporated herein by reference.

TECHNICAL FIELD

The technology disclosed herein relates to a semiconductor device.

BACKGROUND

Japanese Patent Application Publication No. 2017-55044 describes a semiconductor device. This semiconductor device includes a semiconductor element including a signal pad, an encapsulant encapsulating the semiconductor element, and a lead connected to the signal pad. The lead includes a first end located outside the encapsulant and a second end located within the encapsulant, and is connected to the signal pad via a bonding wire within the encapsulant. The lead includes an upper surface extending from the first end to the second end, and the upper surface includes a joined section where the bonding wire is joined and a rough section located within the encapsulant and having a higher surface roughness than the joined section. According to such a configuration, the rough section provided at the lead enhances adhesion between the lead and the encapsulant.

SUMMARY

In a manufacturing process of the semiconductor device above, the rough section is formed at the lead by laser irradiation, and the bonding wire is then joined to the joined section of the lead. In this respect, when the lead is irradiated with the laser, minute debris (e.g., oxides) may scatter from an irradiated area and contaminate the surface of the lead. Such debris attaching to the joined section, in particular, may cause insufficient joint strength between the lead and the bonding wire. The disclosure herein provides a technology capable of solving or reducing such a problem.

The present teaching may provide a semiconductor device. The semiconductor device may comprise a semiconductor element comprising a signal pad, an encapsulant encapsulating the semiconductor element and a lead comprising a first end located outside the encapsulant and a second end located within the encapsulant. The lead may be connected to the signal pad via a bonding wire within the encapsulant. The lead may comprise an upper surface extending from the first end to the second end. The upper surface may include a joined section where the bonding wire is joined and a rough section located within the encapsulant and having a higher surface roughness than the joined section. The rough section may be at least partly located lower than the joined section. Specifically, when the semiconductor device is arranged such that a normal vector of the jointed section is directed upwardly, the rough section is at least partly located lower than a horizontal plane containing the jointed section.

In the semiconductor device above, the lead is configured such that the rough section is at least partly located lower than the joined section. According to such a configuration, in a manufacturing process of the semiconductor device, when the rough section of the lead is formed by laser irradiation, minute debris that scatters from an irradiated area (i.e., the rough section) is less likely to reach the joined section. Since attachment of the debris to the joined section is reduced, a problem such as insufficient joint strength between the lead and the bonding wire is solved or reduced.

The present teaching may also provide another semiconductor device. The semiconductor device may comprise a semiconductor element comprising a signal pad, an encapsulant encapsulating the semiconductor element and a lead comprising a first end located outside the encapsulant and a second end located within the encapsulant. The lead may be connected to the signal pad via a bonding wire within the encapsulant. The lead may comprise an upper surface extending from the first end to the second end. The upper surface may include a joined section where the bonding wire is joined and a rough section located within the encapsulant and having a higher surface roughness than the joined section. The upper surface of the lead may further comprise a hole or a groove located between the joined section and the rough section.

In the semiconductor device above, the upper surface of the lead is provided with the hole or the groove located between the rough section and the joined section. When the rough section of the lead is formed by laser irradiation, debris that scatters from the rough section partly reaches the joined section by moving along or bouncing off the upper surface of the lead. Therefore, the provision of the hole or the groove between the rough section and the joined section can at least partly suppress such debris from reaching the joined section. Since attachment of the debris to the joined section is reduced, the problem such as insufficient joint strength between the lead and the bonding wire is solved or reduced.

DETAILED DESCRIPTION

Figure 1:
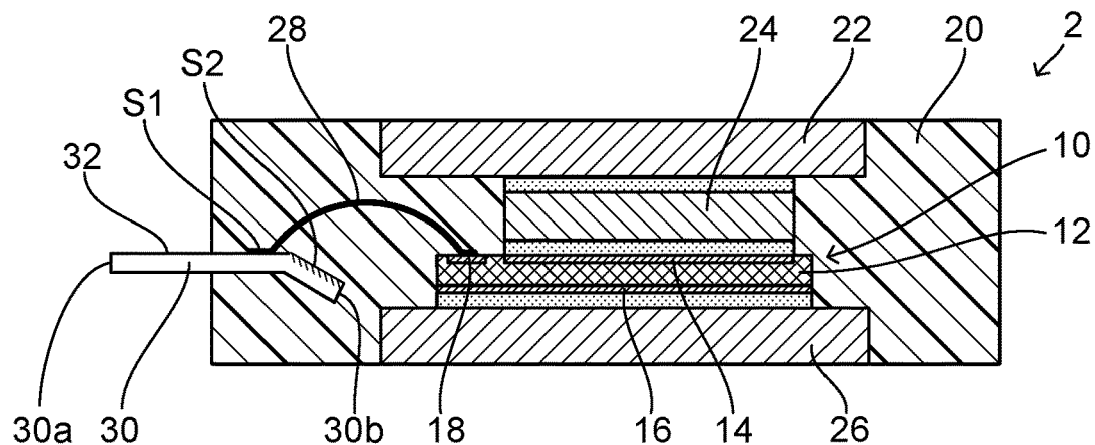
FIG. 1 is a cross-sectional view schematically illustrating a configuration of a semiconductor device 2.

In an embodiment of the present technology, the rough section may be entirely located lower than the joined section. According to such a configuration, debris that scatters from the rough section is much less likely to reach the joined section, so attachment of the debris to the joined section is further reduced.

In an embodiment of the present technology, the rough section may be inclined upwardly toward the joined section. In other words, when the semiconductor device is arranged such that a normal vector of the joined section is directed upwardly, the rough section may be inclined upwardly toward the joined section. According to such a configuration, much of the debris generated at the rough section scatters in a direction apart from the joined section, so attachment of the debris to the joined section is further reduced.

In an embodiment of the present technology, the upper surface of the lead may further include an intermediate section located between the joined section and the rough section. In this case, the intermediate section may be inclined upwardly toward the joined section. According to such a configuration, the joined section and the rough section can be located at different heights depending on an inclination angle or a length of the intermediate section.

In an embodiment of the present technology, the upper surface of the lead may further include a hole or a groove located between the joined section and the rough section. According to such a configuration, as mentioned above, the debris that is to reach the joined section by moving along or bouncing off the upper surface of the lead can be reduced.

In an embodiment of the present technology, the rough section may be located between the second end of the lead and the joined section. According to such a configuration, adhesion between the lead and the encapsulant can be enhanced at an end portion of the lead that has a high degree of freedom, so peel-off between the lead and the encapsulant can be prevented effectively.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENTS

With reference to the drawings, a semiconductor device 2 according to an embodiment will be described. The semiconductor device 2 according to the present embodiment can be adopted in a converter or an inverter in, for example, an electric vehicle, although not particularly limited thereto. The electric vehicle herein includes various types of vehicles of which wheel is driven by a motor, such as a hybrid vehicle, a fuel-cell vehicle, or a rechargeable electric vehicle.

As illustrated in FIG. 1, the semiconductor device 2 includes a semiconductor element 10 and an encapsulant 20 encapsulating the semiconductor element 10. The encapsulant 20 is constituted of an insulating material. The material that constitutes the encapsulant 20 may be a thermosetting resin material such as an epoxy resin, although not particularly limited thereto. The semiconductor element 10 may be a power semiconductor element such as a MOSFET (Metal-Oxide-Semiconductor Field-Effect Transistor) or an IGBT (Insulated Gate Bipolar Transistor), although not particularly limited thereto. The semiconductor device 2 may include a plurality of the semiconductor elements 10, and the plurality of semiconductor elements 10 may be connected in parallel or in series.

The semiconductor element 10 includes a semiconductor substrate 12, first main electrodes 14, a second main electrode 16, and a plurality of signal pads 18. The semiconductor substrate 12 is constituted of a semiconductor material such as silicon (Si), silicon carbide (SiC), or gallium nitride (GaN). The semiconductor substrate 12 has an element structure such as a MOSFET or an IGBT provided therein. The first main electrode 14 is provided on an upper surface of the semiconductor substrate 12, and the second main electrode 16 is provided on a lower surface of the semiconductor substrate 12. The first main electrode 14 and the second main electrode 16 are connected to each other via the element structure in the semiconductor substrate 12. A material that constitutes the first main electrode 14 and the second main electrode 16 may be metal such as aluminum (Al), nickel (Ni), or gold (Au), although not particularly limited thereto.

The plurality of signal pads 18 is provided on the upper surface of the semiconductor substrate 12. Each of the signal pads 18 is a small electrode that outputs a predetermined signal and is constituted of a conductor. The plurality of signal pads 18 includes a signal pad to which a drive signal for the semiconductor device 2 is inputted, a signal pad that outputs a signal according to a temperature of the semiconductor device 2, a signal pad that outputs a signal corresponding to a current flowing in the semiconductor device 2, and a signal pad that outputs a signal corresponding to a voltage of the first main electrode 14, for example. It should be noted that the number or a specific function of the signal pads 18 can be modified variously. The material that constitutes the first main electrode 14 and the second main electrode 16 may be metal such as, aluminum (Al) or copper (Cu), although not particularly limited thereto.

The semiconductor device 2 further includes an upper conductor plate 22, a conductor spacer 24, a lower conductor plate 26, and signal leads 30. The upper conductor plate 22 is joined to the first main electrode 14 of the semiconductor element 10 via the conductor spacer 24. The upper conductor plate 22 and the conductor spacer 24 are constituted of metal such as copper, and the first main electrode 14 of the semiconductor element 10 is electrically connected to the upper conductor plate 22. The upper conductor plate 22 constitutes a part of an electric circuit in the semiconductor device 2. Moreover, the upper conductor plate 22 is exposed at an upper surface of the encapsulant 20 and also functions as a heat radiating plate that dissipates heat of the semiconductor element 10 to an outside.

The lower conductor plate 26 is joined to the second main electrode 16 of the semiconductor element 10. The lower conductor plate 26 is constituted of metal such as copper, and the second main electrode 16 of the semiconductor element 10 is electrically connected to the lower conductor plate 26. The lower conductor plate 26 constitutes a part of the electric circuit in the semiconductor device 2. Moreover, the lower conductor plate 26 is exposed at a lower surface of the encapsulant 20 and also functions as a heat radiating plate that dissipates heat of the semiconductor element 10 to the outside. In other words, the semiconductor device 2 in the present embodiment includes a double-sided cooling structure in which the heat radiating plates are exposed at both of the surfaces of the encapsulant 20.

Figure 2:
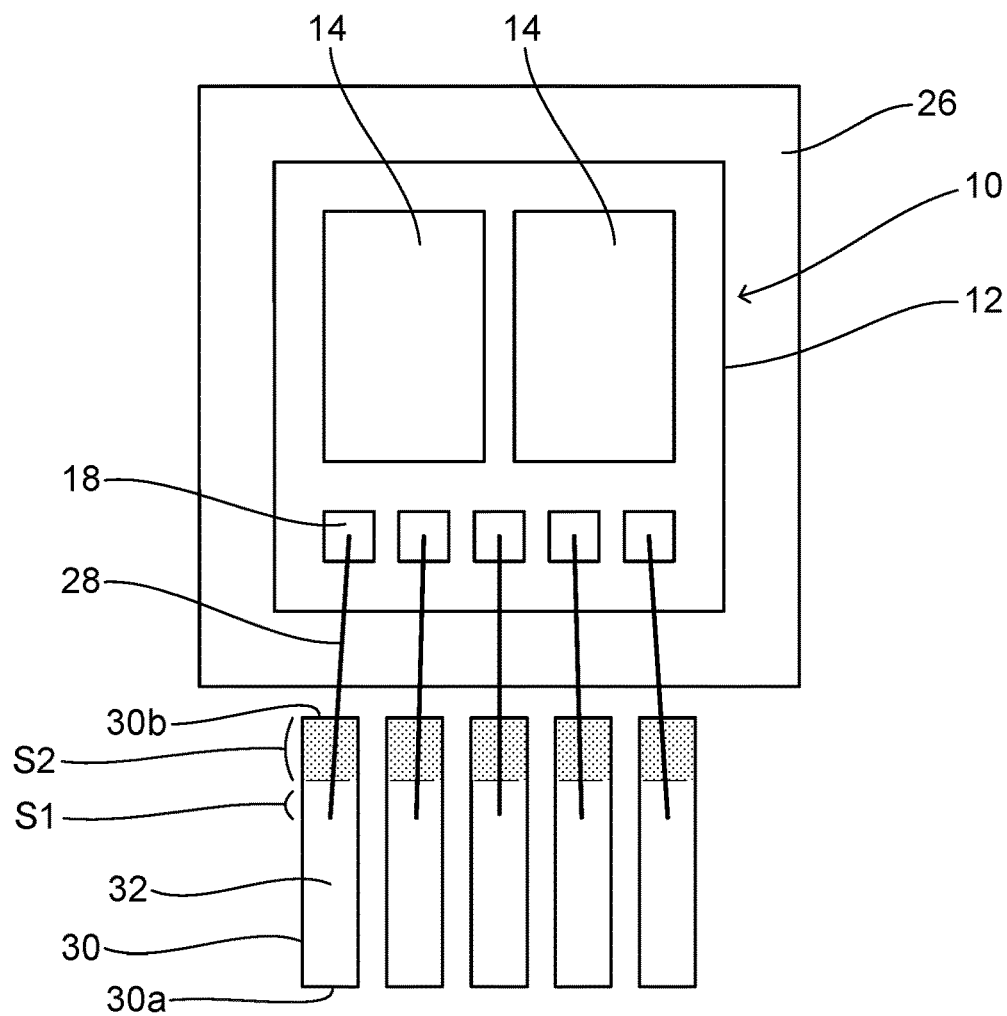
FIG. 2 is a plan view schematically illustrating a part of the configuration of the semiconductor device 2.
Figure 3:
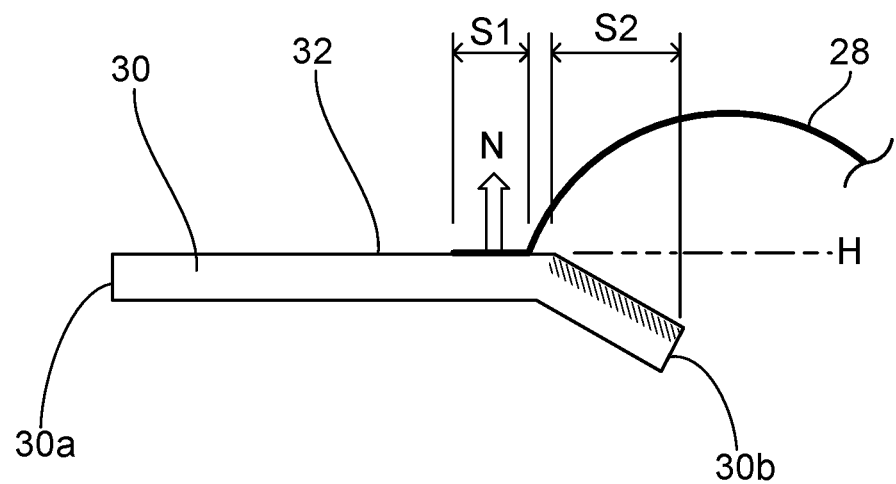
FIG. 3 illustrates a signal lead 30.

As illustrated in FIGS. 1, 2, and 3, each of the signal leads 30 includes a first end 30a located outside the encapsulant 20 and a second end 30b located within the encapsulant 20, and is connected to corresponding one of the signal pads 18 via a bonding wire 28 within the encapsulant 20. Each of the signal leads 30 is a member constituted of a conductor and can be constituted of metal such as copper. The plurality of signal leads 30 is connected to an external controller (not illustrated) and transmits various signals between the controller and the semiconductor element 10. A material that constitutes the bonding wires 28 may be metal such as aluminum (Al) or copper (Cu), although not particularly limited thereto.

Each bonding wire 28 is joined to an upper surface 32 of corresponding one of the signal leads 30. In other words, in the description of the present embodiment, "upwardly" and "lower" are defined based on an orientation of the semiconductor device 2 when a surface of the signal lead 30 where the bonding wire 28 is joined is the upper surface of the signal lead 30. The upper surface 32 extending from the first end 30a to the second end 30b of the signal lead 30 includes a joined section S1 where the bonding wire 28 is joined and a rough section S2 located within the encapsulant 20 and having a higher surface roughness than the joined section S1. In the disclosure herein, a high surface roughness means that at least an arithmetic mean roughness is high. The rough section S2 of the signal lead 30 enhances adhesion between the signal lead 30 and the encapsulant 20.

Figure 4:
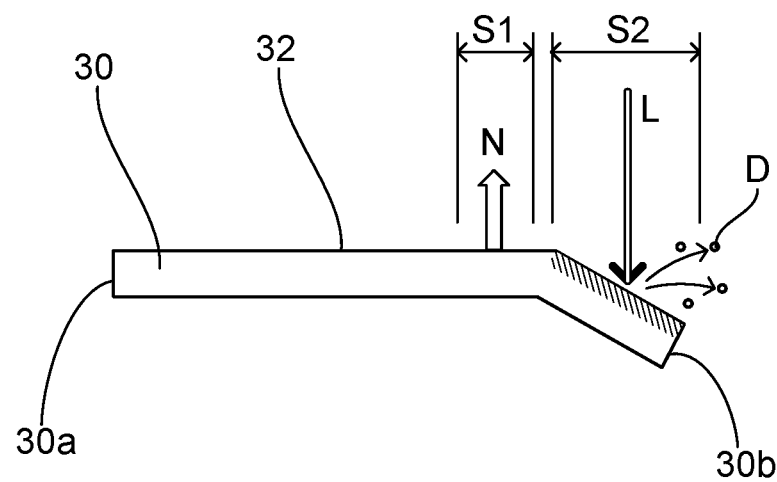
FIG. 4 illustrates how a rough section S2 of the signal lead 30 is irradiated with a laser L.

In a manufacturing process of the semiconductor device 2, the rough sections S2 are formed at the signal leads 30 respectively by laser irradiation, and the bonding wires 28 are then joined to the joined sections S1 of the signal leads 30. In this respect, as illustrated in FIG. 4, when the signal lead 30 is irradiated with a laser L, minute debris D (e.g., oxides) may scatter from an irradiated area (i.e., the rough section S2) and contaminate the surface of the signal lead 30. When the bonding wire 28 is joined to the joined section S1, such debris D attaching to the joined section S1, in particular, may cause insufficient joint strength between the signal lead 30 and the bonding wire 28.

In regard to the problem above, as illustrated in FIG. 3, the signal lead 30 in the present embodiment is bent between the joined section S1 and the rough section S2, and the rough section S2 is entirely located lower than the joined section S1. Specifically, when the semiconductor device 2 is arranged such that a normal vector N of the joined section S1 is directed upwardly, the rough section S2 is located lower than a horizontal plane H that includes the joined section S1. According to such a configuration, as illustrated in FIG. 4, when the rough section S2 of the signal lead 30 is irradiated with the laser L, the minute debris D that scatters from the irradiated area (i.e., the rough section S2) is less likely to reach the joined section S1. Since attachment of the debris D to the joined section S1 is reduced, the aforementioned problem of insufficient joint strength between the signal lead 30 and the bonding wire 28 is solved or at least partly reduced. The laser L's irradiation can be conducted toward the rough section S2 from above.

Additionally, in the signal lead 30 in the present embodiment, the rough section S2 is inclined upwardly toward the joined section S1. In other words, as illustrated in FIG. 3, when the semiconductor device 2 is arranged such that the normal vector N of the joined section S is directed upwardly (i.e., upwardly in FIG. 3), the rough section S2 may be inclined upwardly toward the joined section S1. According to such a configuration, much of the debris D generated in the rough section S2 scatters in a direction apart from the joined section S1, so the attachment of the debris D to the joined section S1 is further reduced.

As mentioned above, in the signal lead 30 in the present embodiment, the rough section S2 is entirely located lower than the joined section S1. However, as another embodiment, only a part of the rough section S2 may be located lower than the joined section S1. Such a configuration can also bring the effect of reducing the attachment of the debris D to the joined section S1, although in a limited way. Especially in the case where the rough section S2 is inclined upwardly toward the joined section S1, the attachment of the debris D to the joined section S1 may be reduced sufficiently, even if the rough section S2 is partly located higher than the joined section S1.

Figure 5:
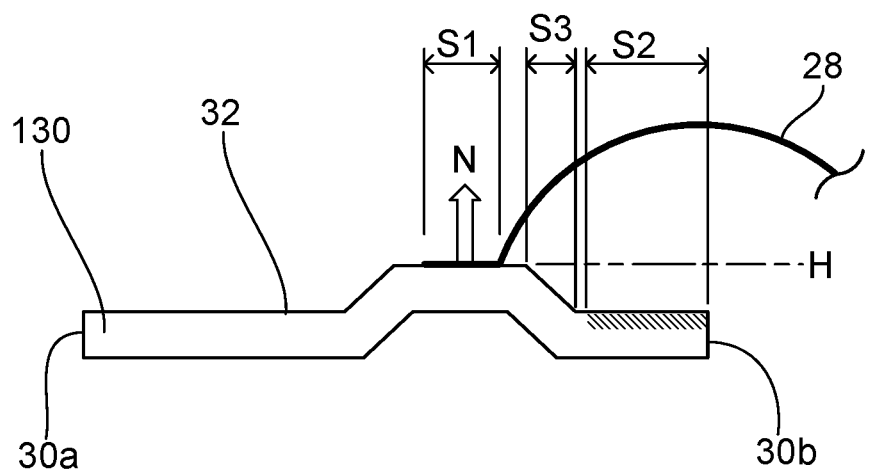
FIG. 5 illustrates a signal lead 130 according to a variant.
Figure 6:
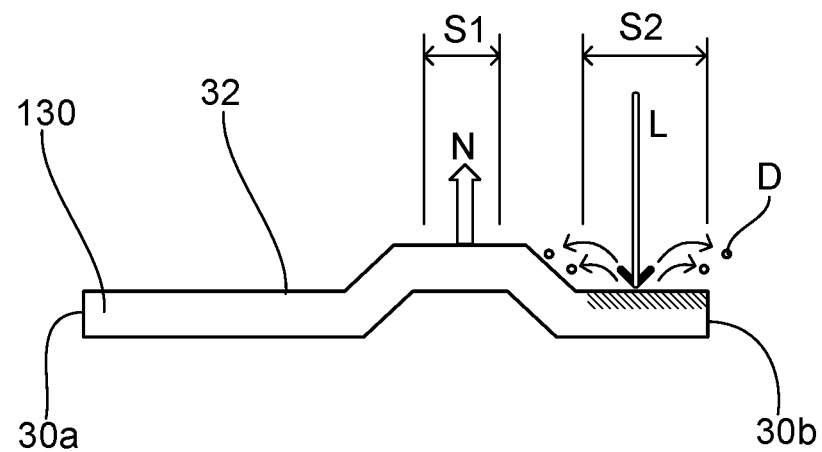
FIG. 6 illustrates how the rough section S2 of the signal lead 130 is irradiated with the laser L.

With reference to FIGS. 5 and 6, a signal lead 130 according to a variant will be described. It should be noted that configurations same as those of the signal lead 30 mentioned above will be denoted with the same signs and their descriptions will not be repeated here. As illustrated in FIG. 5, in this signal lead 130, the upper surface 32 of the signal lead 130 further includes an intermediate section S3 located between the joined section S1 and the rough section S2. The intermediate section S3 is inclined upwardly toward the joined section S1. According to such a configuration, the joined section S1 and the rough section S2 can be located at different heights according to an inclination angle or a length of the intermediate section S3. Thereby, as illustrated in FIG. 6, when the rough section S2 of the signal lead 130 is irradiated with the laser L, the minute debris D that scatters from the irradiated area (i.e., the rough section S2) is less likely to reach the joined section S1. The rough section S2 may be inclined as in the signal lead 30 illustrated in FIGS. 3 and 4, or may not be inclined as such.

Figure 7:
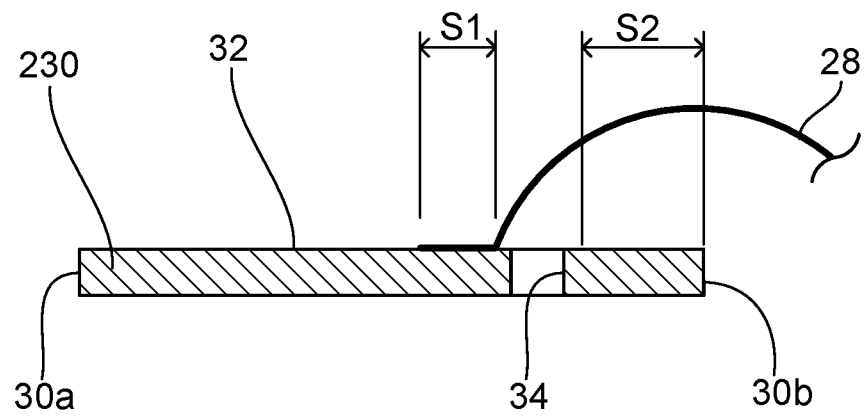
FIG. 7 illustrates a signal lead 230 according to another variant.
Figure 8:
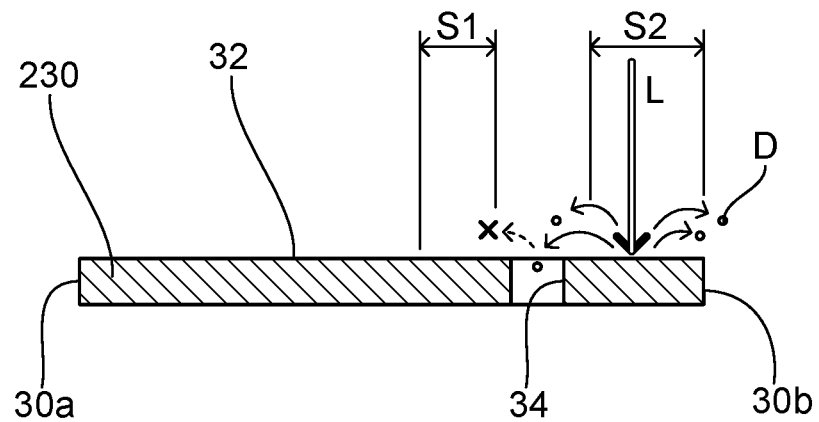
FIG. 8 illustrates how the rough section S2 of the signal lead 230 is irradiated with the laser L.

With reference to FIGS. 7 and 8, a signal lead 230 according to another variant will be described. It should be noted that configurations same as those of the signal lead 30 mentioned above will be denoted with the same signs and their descriptions will not be repeated here. As illustrated in FIG. 7, in this signal lead 230, the upper surface 32 of the signal lead 230 further includes a hole 34 located between the joined section S1 and the rough section S2. According to such a configuration, as illustrated in FIG. 8, when the rough section S2 of the signal lead 230 is irradiated with the laser L, a part of the debris D that scatters from the rough section 82 is suppressed from reaching the joined section S1 by moving along or bouncing off the upper surface 32 of the signal lead 230. The attachment of the debris D to the joined section S1 is thereby reduced. The upper surface 32 of the signal lead 230 may be provided with a groove instead of the hole 34. Moreover, the hole 34 or the groove in the signal lead 230 illustrated in FIGS. 7 and 8 may also be provided in the signal lead 30 illustrated in FIGS. 1 to 4 and in the signal lead 130 illustrated in FIGS. 5 and 6.

In the signal leads 30, 130, and 230 mentioned above, the rough section S2 may be located between the second end 30b of the signal leads 30, 130 and 230 and the joined section S1. According to such a configuration, adhesion between the encapsulant 20 and the signal leads 30, 130, and 230 is enhanced at end portions of the signal leads 30, 130, and 230 which have a high degree of freedom, so peel-off between the encapsulant 20 and the signal leads 30, 130, and 230 can be prevented effectively.

What is claimed is:

1. A semiconductor device comprising:
a semiconductor element comprising a signal pad;
an encapsulant encapsulating the semiconductor element; and
a lead comprising a first end located outside the encapsulant and a second end located within the encapsulant, the lead being connected to the signal pad via a bonding wire within the encapsulant,
wherein
the lead comprises an upper surface extending between the first end and the second end along a longitudinal axis of the lead and a lower surface extending between the first end and the second end along the longitudinal axis of the lead, the upper surface and the lower surface being located on opposite sides of the lead,
the upper surface comprises a joined section where the bonding wire is joined and a rough section located within the encapsulant and having a higher surface roughness than the joined section, and
the rough section is at least partly located lower than the joined section.

2. The semiconductor device according to claim 1, wherein the rough section is entirely located lower than the joined section.

3. The semiconductor device according to claim 1, wherein the rough section is inclined upwardly toward the joined section along the longitudinal axis of the lead.

4. The semiconductor device according to claim 1, wherein the upper surface of the lead further comprises an intermediate section located between the joined section and the rough section, the intermediate section being inclined upwardly toward the joined section and having a lower surface roughness than the rough section.

5. The semiconductor device according to claim 1, wherein the upper surface of the lead further comprises a hole or a groove located between the joined section and the rough section.

6. The semiconductor device according to claim 1, wherein the rough section is located between the second end of the lead and the joined section.

7. A semiconductor device comprising:
a semiconductor element comprising a signal pad;
an encapsulant encapsulating the semiconductor element; and
a lead comprising a first end located outside the encapsulant and a second end located within the encapsulant, the lead being connected to the signal pad via a bonding wire within the encapsulant,
wherein
the lead comprises an upper surface extending between the first end and the second end along a longitudinal axis of the lead and a lower surface extending between the first end and the second end along the longitudinal axis of the lead, the upper surface and the lower surface being located on opposite sides of the lead,
the upper surface comprises a joined section where the bonding wire is joined, and a rough section located within the encapsulant and having a higher surface roughness than the joined section, and
the upper surface of the lead further comprises a through hole located between the joined section and the rough section, the through hole extending through the lead from the upper surface to the lower surface.

8. The semiconductor device according to claim 7, wherein the rough section is located between the second end of the lead and the joined section.

* * * * *